(12) United States Patent
Li (10) Patent No.: US 10,056,268 B2
(45) Date of Patent: Aug. 21, 2018

(54) LIMITING ELECTRONIC PACKAGE WARPAGE

(71) Applicant: International Business Machines Corporation, Armonk, NY (US)

(72) Inventor: Shidong Li, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/792,803

(22) Filed: Oct. 25, 2017

(65) Prior Publication Data
US 2018/0047590 A1 Feb. 15, 2018

Related U.S. Application Data

(62) Division of application No. 14/724,097, filed on May 28, 2015, now Pat. No. 9,892,935.

(51) Int. Cl.
*H01L 21/48* (2006.01)
*H01L 23/367* (2006.01)
(Continued)

(52) U.S. Cl.
CPC .......... *H01L 21/4853* (2013.01); *H01L 21/50* (2013.01); *H01L 23/10* (2013.01); *H01L 23/3675* (2013.01); *H01L 23/3677* (2013.01); *H01L 23/42* (2013.01); *H01L 23/562* (2013.01); *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 24/92* (2013.01); *H01L 2224/131* (2013.01); *H01L 2224/16227* (2013.01); *H01L 2224/32225* (2013.01); *H01L 2224/32245* (2013.01); *H01L 2224/45099* (2013.01); *H01L 2224/48227* (2013.01); *H01L 2224/73204* (2013.01); *H01L 2224/73253* (2013.01); *H01L 2224/81815* (2013.01); *H01L 2224/92125* (2013.01); *H01L 2924/14* (2013.01); *H01L 2924/1433* (2013.01); *H01L 2924/1434* (2013.01); *H01L 2924/15311* (2013.01); *H01L 2924/15312* (2013.01); *H01L 2924/15313* (2013.01); *H01L 2924/1659* (2013.01); *H01L 2924/16152* (2013.01);
(Continued)

(58) Field of Classification Search
CPC ............ H01L 23/3675; H01L 23/3672; H01L 23/3736
See application file for complete search history.

(56) References Cited

U.S. PATENT DOCUMENTS

5,868,887 A   2/1999   Sylvester et al.
6,011,697 A   1/2000   Budnaitis et al.
(Continued)

*Primary Examiner* — Matthew Reames
*Assistant Examiner* — Wilner Jean Baptiste
(74) *Attorney, Agent, or Firm* — ZIP Group PLLC (57) ABSTRACT

An electronic package includes a carrier, semiconductor chip, a lid, and a lid-ring. The carrier includes a top surface and a bottom surface configured to be electrically connected to a system board. The semiconductor chip is electrically connected to the top surface. The lid is attached to the top surface enclosing semiconductor chip and includes a perimeter recess. The lid-ring is juxtaposed within the perimeter recess. The lid-ring exerts a reverse bending moment upon the lid to limit warpage of the electronic package.

14 Claims, 6 Drawing Sheets

(51) Int. Cl.
*H01L 21/50* (2006.01)
*H01L 23/42* (2006.01)
*H01L 23/10* (2006.01)
*H01L 23/00* (2006.01)

(52) U.S. Cl.
CPC ........... *H01L 2924/16251* (2013.01); *H01L 2924/16747* (2013.01); *H01L 2924/19041* (2013.01); *H01L 2924/19043* (2013.01); *H01L 2924/19105* (2013.01); *H01L 2924/3511* (2013.01)

(56) References Cited

U.S. PATENT DOCUMENTS

| | | |
|---|---|---|
| 6,014,317 A | 1/2000 | Sylvester |
| 6,072,232 A | 6/2000 | Li et al. |
| 6,165,820 A | 12/2000 | Pace |
| 6,183,592 B1 | 2/2001 | Sylvester |
| 6,191,359 B1 | 2/2001 | Sengupta et al. |
| 6,218,730 B1 * | 4/2001 | Toy ............... H01L 23/10 257/704 |
| 6,262,489 B1 | 7/2001 | Koors et al. |
| 6,753,922 B1 | 6/2004 | Sengupta |
| 6,949,404 B1 | 9/2005 | Fritz et al. |
| 7,026,707 B2 | 4/2006 | Li et al. |
| 7,259,445 B2 | 8/2007 | Lau et al. |
| 7,906,845 B1 * | 3/2011 | Galloway ......... H01L 23/04 257/707 |
| 8,455,998 B2 * | 6/2013 | Iruvanti ............ H01L 23/10 257/704 |
| 2011/0095416 A1 | 4/2011 | Sarlhan |
| 2013/0154085 A1 | 6/2013 | Choi et al. |

* cited by examiner

LIMITING ELECTRONIC PACKAGE WARPAGE

FIELD OF THE EMBODIMENTS

Embodiments of the present invention generally relate to electronic devices and more specifically to limiting warpage within electronic device packages.

DESCRIPTION OF THE RELATED ART

An electronic package may include an integrated circuit (IC) chip, semiconductor die, processing module, and the like, packaged onto a carrier or substrate. The package may be encapsulated by a cover having high thermal conductivity. Flatness of the package is important to ensure reliable higher level device packaging. For example, it is important that the carrier be flat to ensure a reliable electrical connection with a system board and it is important that the cover be flat to ensure a reliable thermal connection with a heat spreader, such as a heat sink.

Known techniques to reduce package warpage are to utilize a thick cover and to utilize a carrier having a low coefficient of thermal expansion (CTE). A disadvantage in utilizing the thick cover is the overall increase in package thickness and the potential benefits of the low CTE carrier are limited because of the relative large percentage of copper therein.

SUMMARY

In an embodiment of the present invention an electronic package is presented. The electronic package includes a carrier that includes a top surface and a bottom surface configured to be electrically connected to a system board. The electronic package includes a semiconductor chip electrically connected to the top surface of the carrier. The electronic package includes a lid attached to the top surface of the carrier that encloses semiconductor chip. The lid includes a perimeter recess within the upper half of the lid. The perimeter recess includes a horizontal recess and vertical recess comprising two recess sidewalls. The electronic package includes a lid-ring attached to the lid within the perimeter recess. The lid ring includes a horizontal portion orthogonal and distally connected to a vertical portion. The horizontal portion includes a greater width than height, is parallel with the semiconductor chip, and is juxtaposed within the horizontal recess. The vertical portion includes a greater height than width and is juxtaposed between the two vertical recess sidewalls. A perimeter sidewall of the lid-ring horizontal portion is coplanar with a perimeter sidewall of the lid. The lid-ring applies a contracting force against the upper half of the lid to exert a reverse bending moment upon the lid.

In an embodiment of the present invention an electronic device is presented. The electronic device includes a carrier that includes a top surface and a bottom surface configured to be electrically connected to a system board. The electronic device includes a semiconductor chip electrically connected to the top surface of the carrier. The electronic device includes a lid attached to the top surface of the carrier that encloses semiconductor chip. The lid includes a perimeter recess within the upper half of the lid. The perimeter recess includes a horizontal recess and vertical recess comprising two recess sidewalls. The electronic device includes a lid-ring attached to the lid within the perimeter recess. The lid ring includes a horizontal portion orthogonal and distally connected to a vertical portion. The horizontal portion includes a greater width than height, is parallel with the semiconductor chip, and is juxtaposed within the horizontal recess. The vertical portion includes a greater height than width and is juxtaposed between the two vertical recess sidewalls. A perimeter sidewall of the lid-ring horizontal portion is coplanar with a perimeter sidewall of the lid. The lid-ring applies a contracting force against the upper half of the lid to exert a reverse bending moment upon the lid.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
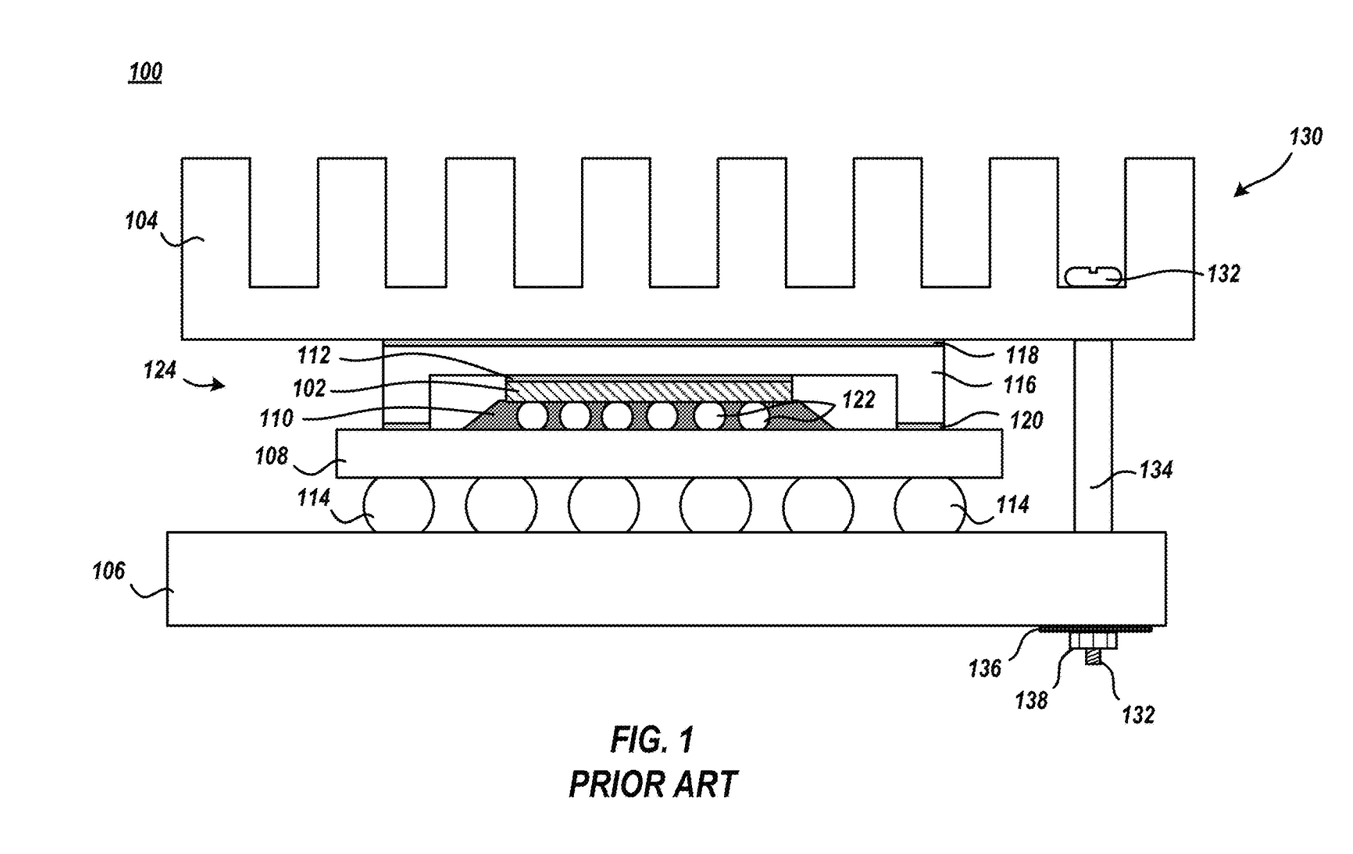
FIG. 1 depicts an electronic device utilizing a prior art electronic package.

FIG. 1 depicts a prior art electronic device 100 utilizing electronic package 124. Electronic device 100 may be, for example, a computer, server, mobile device, tablet, and the like. Electronic package 124 includes IC chip 102, carrier 108, interconnects 122, underfill 110, thermal interface material 112, lid 116, and adhesive 120. Chip 102 may be an integrated circuit, semiconductor die, processor, microchip, and the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may electrically isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108 a lid 116 is attached to carrier 108 with adhesive 120 to cover chip 102. Generally, during operation of electronic device 100, heat needs to be removed from chip 102. In this situation, lid 116 is both a cover and a conduit for heat transfer. As such, a thermal interface material 112 may thermally join lid 116 and chip 102.

Electronic package 124 may be connected to a system board 106 via interconnects 114. System board 106 may be the main printed circuit board of electronic device 100 and includes electronic components, such as a graphics processing unit, memory, and the like, and provides connectors for other peripherals. Interconnects 114 electrically connect the lower side of carrier 108 to system board 106 and may be a wire bond, solder bond, stud, conductive ball, conductive button, and the like. Interconnects 114 may be larger and thus more robust than interconnects 122. When electronic package 124 is seated upon system board 106 a second reflow process may be performed to join interconnects 114 to electrical contacts of both carrier 108 and motherboard 106.

To assist in the removal of heat from chip 102 a heat sink 104 may be thermally joined to electronic package 124 via a thermal interface material 118. Heat sink 104 may be a passive heat exchanger that cools chip 102 by dissipating heat into the surrounding air. As such, during operation of electronic device 100, a thermal path exists from chip 102 to heat sink 104 through thermal interface material 112, lid 116, and thermal interface material 118, and the like. Heat sink 104 may be connected to system board 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon electronic package 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heat sink 104 upon electronic package 124.

Thermally connected, joined, and the like, shall herein mean that elements that which are thermally connected are able to efficiently transfer heat there between (e.g., air gaps between the elements are minimized). Electrically connected, and the like, shall herein mean that current is able to be efficiently passed from one element to another element (e.g., current flows from a conductor in one element to a conductor in the other element).

Figure 2:
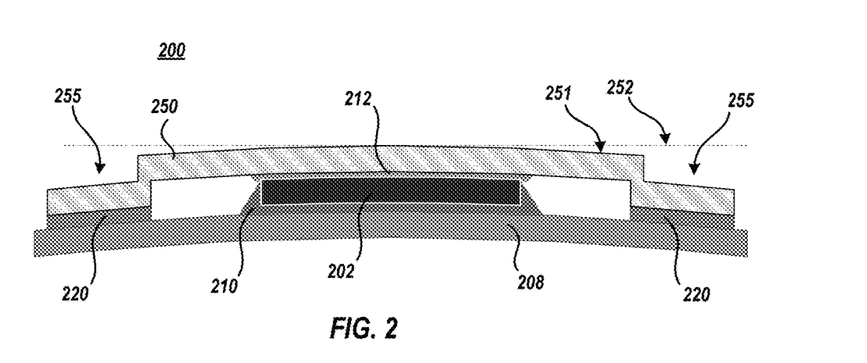
FIG. 2-FIG. 7 depict exemplary electronic packages, according to one or more embodiments of the present invention.

FIG. 2 depicts an exemplary electronic package 200 according to various embodiments of the present invention. Electronic package 200 may include IC chip 202, carrier 208, interconnects 222 (not shown), underfill 210, thermal interface material 212, lid 250, and seal band 220.

Carrier 208 provides a base on which the chip 202 is mounted and electrically connected thereto via a plurality of interconnects (e.g. solder, pillars, wire bonds, and the like). Carrier 208 may be composed of ceramics or organic materials. If organic, carrier 208 may include multiple layers of metallization and dielectric materials. Depending upon the configuration of layers, carrier 208 may be a coreless, thin core, or standard core design. The dielectric materials may be, for example, epoxy resin with or without fiberglass fill. In various embodiments, carrier 208 may interconnect with other devices such as a socket (pin grid array, land grid array, ball grid array, and the like). In various embodiments, carrier 208 may include other devices besides chip 202, for example, surface mount devices (e.g. capacitors, resistors, and the like).

Chip 202 may be for example a microchip, microprocessor, graphic processor, combined processor and graphics processor, application specific integrated circuit (ASIC), system on a chip (SOC), three dimensional integrated circuit, system on insulator (SOI), and the like.

Figure 3:
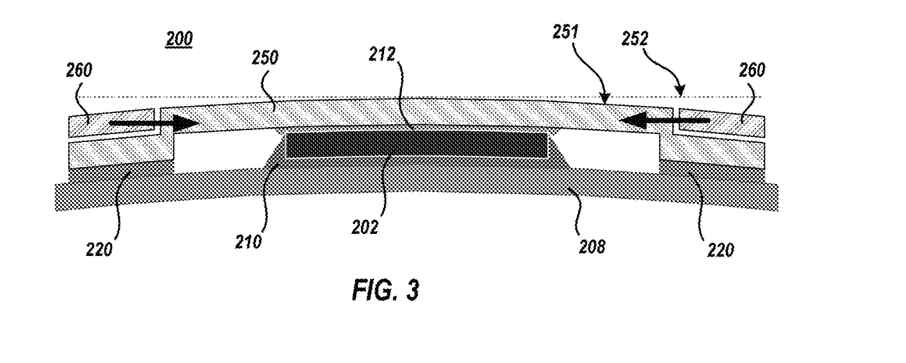

Lid 250 encapsulates the chip 202. The underside of lid 250 is configured to make thermal contact with chip 202 and contact with carrier 208. Therefore, lid 250 may include an underside cavity of a depth of approximately the height of chip 202. The upper side of lid 250 further includes a perimeter recess 255. Recess 255 generally accepts lid-ring 260, as is depicted in FIG. 3 to limit warpage of electronic package 200. Lid 250 may be mechanically fastened to carrier 208 by seal band 220. Seal band 220 is generally an adhesive and may be thermally compliant such that it may adsorb dimensional fluctuations of lid 250 and/or carrier 208 due to thermal expansion. Lid 250 may be made from a thermally conductive material, such as a metal. For example, lid 250 may be formed (e.g., milled, cast, and the like) from copper.

Electronic package 200 may include thermal interface material 212 layers juxtaposed between chip 202 and covers 204. Thermal interface material 212 generally reduces air gaps between chip 202 and lid 250, thereby increasing heat transfer away from chip 202. Thermal interface material 212 may be a thermal gel, thermal compound, thermal paste, heat paste, and the like. In an embodiment, the thickness of thermal interface materials 212 is generally minimized. In certain embodiments, thermal interface material 212 is composed of metallic materials, such as silicone rubber mixed with aluminum and zinc oxide. Other compliant base materials other than silicone rubber and thermally conductive materials may be used.

FIG. 3 depicts an exemplary electronic package 200 according to various embodiments of the present invention. Electronic package 200 may further include lid-ring 260. Lid-ring 260 may be juxtaposed fit with the perimeter recess 255 of lid 250. For example, lid-ring 260 may lay within perimeter recess 25. In some embodiments, lid-ring 260 may be press-fit, interference fit, and the like, into perimeter recess 255. In other embodiments, lid-ring 260 may be fastened to lid 250 via a fastener (e.g., adhesive, seal band, and the like). Lid-ring 260 may be made from a thermally conductive material, such as a metal. In an embodiment, lid 250 and lid-ring 260 are similar metals. In another embodiment, lid 250 and lid-ring 260 are different metals. For example, lid-ring may be formed (e.g., milled, cast, and the like) from aluminum.

In an embodiment, recess 255, and corollary, cover-lid are arranged upon the upper half of lid 250. For example, a plane that bisects the height of lid-ring 260 may be above a plane that bisects the height of lid 250.

Lid-ring 260 generally creates a compressive force upon and from the perimeter of lid 250 inward, as depicted by the arrows of FIG. 3. Such compressive force aids in limiting warpage of electronic package 200. More particularly, the compressive force exerted by lid-ring 260 upon lid 250 helps to maintain flatness of the electronic package 200. For instance, the lid-ring 260 helps to maintain an upper surface 251 of lid 250, an upper surface of carrier 208, and the like, to be parallel with flat plane 252. The compressive force may be generated by the greater contraction of lid-ring 260 relative to lid 250. The contraction of lid-ring 260 exerts a reverse bending moment upon lid 250 to aid in flattening the electronic package 200. For clarity, the convex warpage of electronic package 200 to be prevented may be caused by coefficient of thermal expansion mismatches between the various components of the electronic package 200.

Figure 4:
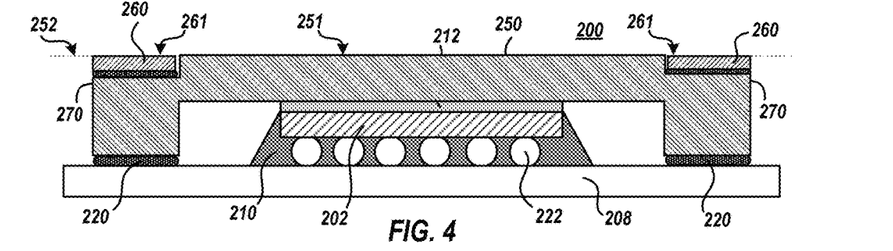
Figure 5:
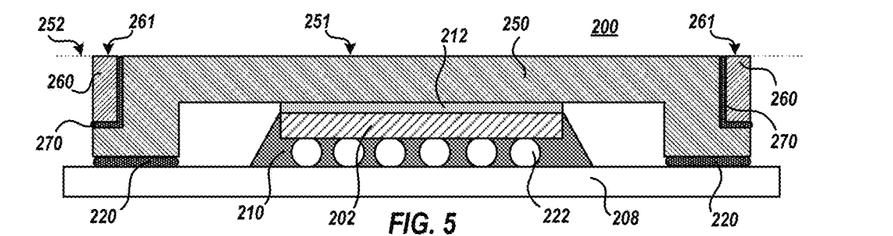
Figure 6:
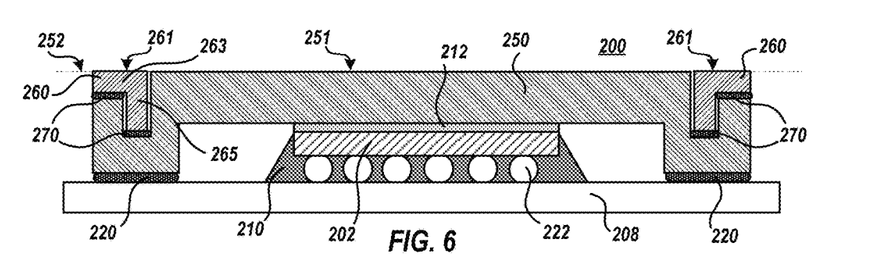

Referring to FIG. 4-FIG. 7 simultaneously, which depict exemplary arrangements of lid-ring 260 upon lid 250. Lid-ring 260 may be fastened to lid 250 a seal band 270. The seal band 270 may be similar to the seal band 220 or may be a different material type configured for metal to metal bonding. The seal band may be upon a single recess 255 surface or upon multiple recess 255 surfaces. For example, seal band 270 may be upon a lower recess 255 surface as shown in FIG. 4, may be upon the lower recess 255 surface and a side recess surface as shown in FIG. 5, and/or may be upon multiple lower recess 255 surfaces as shown in FIG. 6. In some embodiments, the upper surface 251 of lid 250 is coplanar with an upper surface 261 of lid-ring 260.

The seal band 270 and the seal band 220 may be cured at different temperatures. For example, seal band 270 may be cured at a higher temperature. The higher curing temperature allows for lid-ring 260 be heated and cooled from the higher temperature resulting in the contraction of lid-ring 260 relative to lid 250.

Figure 7:
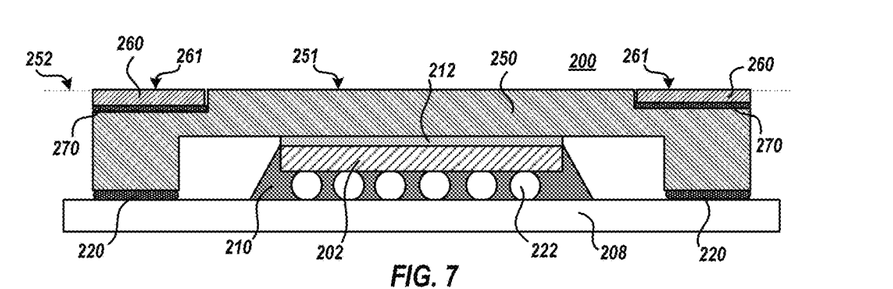

As shown in FIG. 4 and FIG. 7, lid-ring 260 may be generally horizontal (i.e., width of lid ring 260 greater than height of lid-ring 260). As shown in FIG. 5, lid-ring 260 may be generally vertical (i.e. lid-ring height is greater than lid-ring width). As shown in FIG. 6, lid ring may include a generally horizontal portion 263 and a generally vertical portion 265. For clarity, the recess 255 of lid 250 and an associated lid-ring 260 may take upon a variety of geometries such that the lid-ring 260 may juxtapose with the recess 255 of lid 250.

Interconnects 222 electrically connect chip 202 and carrier 208 and may be a wire bond, solder bond, stud, conductive ball, conductive button, and the like. In certain embodiments interconnects 222 may be solder joints composed of lead, lead-free, or a combination material. Underfill 210 may be electrically-insulating, may substantially surround interconnects 222, may isolate individual interconnects 222, and may provide mechanical support between chip 202 and carrier 208. Underfill 210 may also prevent damage to individual interconnects 222 due to thermal expansion mismatches between chip 202 and carrier 208. In certain embodiments, known epoxy or other resins may be used for underfill 210.

When chip 202 is seated upon carrier 208, a reflow process may be performed to join interconnects 222 to electrical contacts of chip 202 and carrier 208. After chip 202 are seated to carrier 208, lid 250 is attached to carrier 208 via seal band 220 and thermally attached to chip 202 via thermal interface material 212. In some applications, electronic package 200 may be connected to a system board.

To assist in the removal of heat from chip 202 a heat sink may be thermally joined to electronic package 200 via compliant thermal interface material applied to the upper surface 251 of lid 250 and/or to the upper surface 261 of lid-ring 260. The heat sink may be a passive heat exchanger that cools chip 202 by dissipating heat into the surrounding air (such as a pin heat sink, electronic system chassis, and the like). Heat sink may also be an active heat exchanger (i.e. forced air, forced liquid cooling system, and the like). As such, during operation of the electronic device, a thermal path exists from chip 202 to the heat sink through thermal interface material 212, lid 250, and the like.

Figure 8:
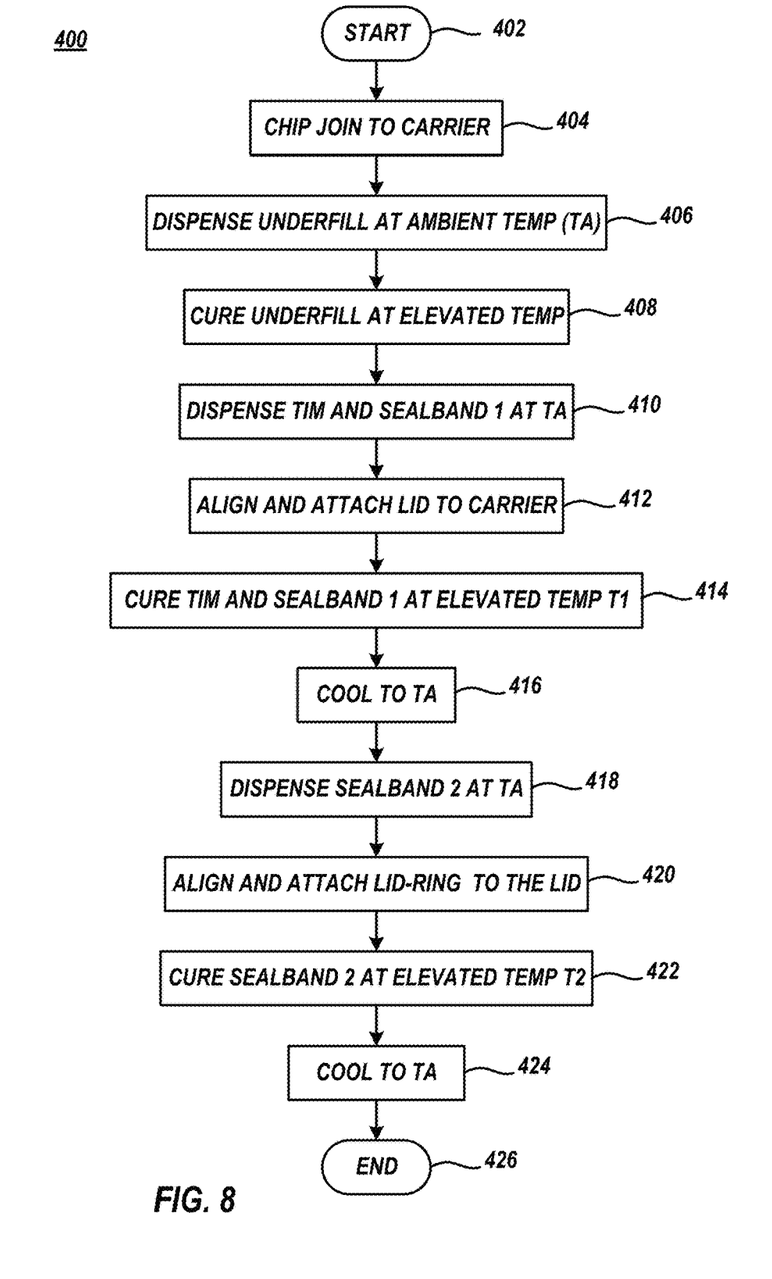
FIG. 8 depicts a method for fabricating an electronic package, according to one or more embodiments of the present invention.

FIG. 8 depicts a method 400 for fabricating an electronic package 200, according to various embodiments of the present invention.

Method 400 begins at block 402 and continues with attaching chip 202 to carrier 208 (block 404). In certain embodiments chip 202 are attached using a flip-chip solder bump processes including a solder reflow. Method 400 may continue by dispensing underfill 210 around the perimeter of chip 202 at an ambient temperature (block 406). The underfill 210 may be drawn under the chip between the chip 202 and carrier 208 by capillary action. In some embodiments, underfill 210 may be subject to curing at an elevated temperature (block 408). The curing of underfill 210 may or may not coincide with the curing of seal band 220 and/or thermal interface material 212.

Method 400 may continue with dispensing thermal interface material 212 upon the top surface of chip 202 and dispensing seal band 220 upon the tope surface of carrier 208 generally around the perimeter of chip 202 at the ambient temperature (block 410). Method 400 may continue with aligning lid 250 with the chip 202 and seal band 220 and thermally attaching the lid 250 with the thermal interface material 212 upon the top surface of chip 202 and contacting seal band 220 (block 412). Method 400 may continue by curing the thermal interface material 212 and/or seal band 220 at an elevated temperature T(1) (block 414). T(1) may be, for example, between 100 degrees Celsius to 165 degrees Celsius. Method 400 may continue by cooling the electronic package to the ambient temperature (block 416).

Method 400 may continue with dispensing seal band 270 within recess 255 of lid 250 (block 418) and may continue with aligning and attaching lid-ring 260 with lid 250 (block 240). For example, lid-ring 260 may be juxtaposed with recess 255 of lid 250. Method 400 may continue with curing seal band 270 at an elevated temperature T(2) (block 422). T(2) may be, for example, higher relative to T(1) but below solder melting temperature (e.g. 275 degrees Celsius). Method 400 may continue by cooling the electronic package to the ambient temperature (block 424). The cooling from T(2) allows for the lid-ring 260 to create a compressive force upon and from the perimeter of lid 250 inward that aids in limiting warpage of the electronic package. Method 400 ends at block 426.

Figure 9:
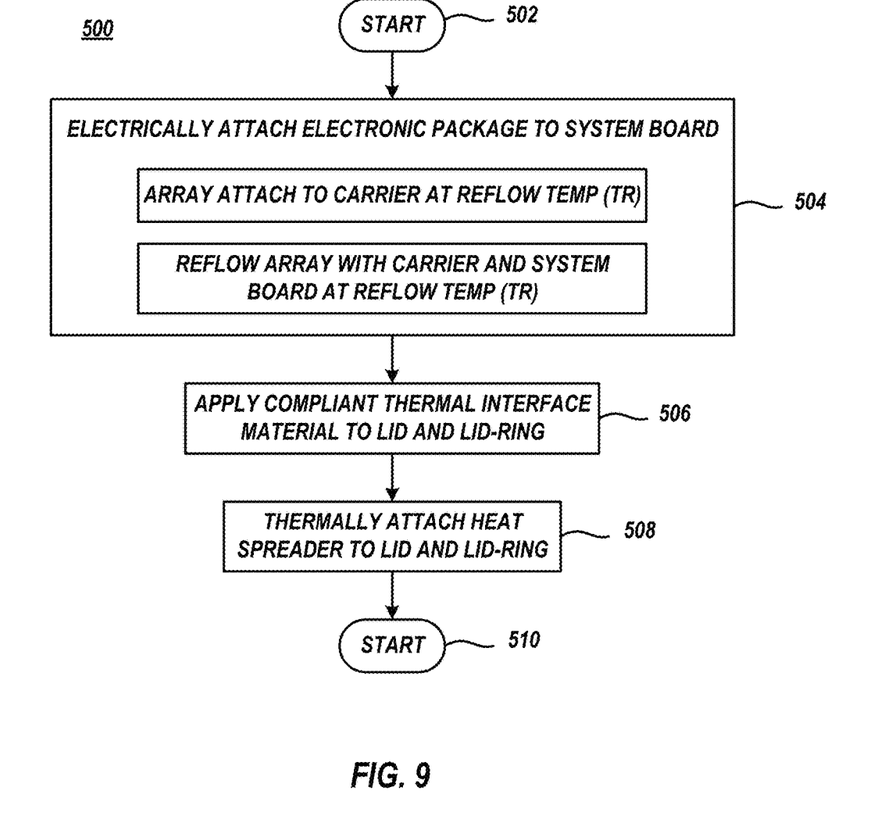
FIG. 9 depicts a method for installing an electronic package into an electronic device, according to one or more embodiments of the present invention.

FIG. 9 depicts a method 500 for installing an electronic package 200 into an electronic device according to various embodiments of the present invention. Method 500 begins at block 502 and continues with electrically attaching electronic package 200 to a system board (block 504). For example, an array such as a land grid array, ball grid array, and the like, may be attached to the carrier at a reflow temperature. The electronic package may be aligned with the system board and heated to reflow the array to electrically connect the electronic package with the system board.

A thermal interface material is applied to electronic package 200 (block 506). For example, thermal interface material may be injected, painted, spread, or otherwise applied to the top surface 251 of lid 250. A heat spreader, such as a heat sink, and the like, may be attached to electronic package 200 (block 508). For example, heat sink may be attached utilizing thermal interface material, thermal tape, epoxy, clip(s), stand offs, and the like. Generally, a force may be applied to secure heat sink to electronic package 200. In another example, a connection device 130 may be utilized to attach heat sink.

Figure 10:
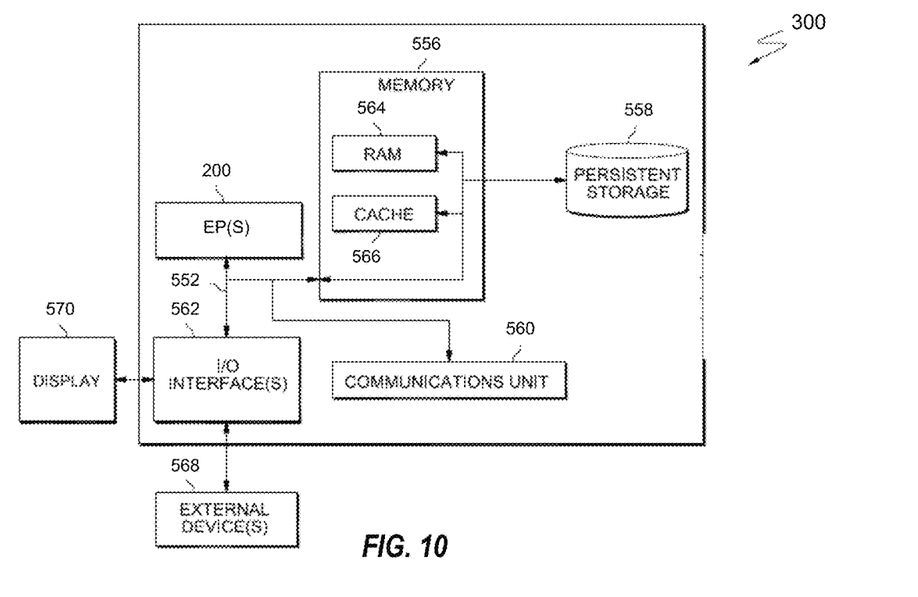
FIG. 10 depicts a block diagram of an exemplary electronic device that utilizes a electronic package, according to one or more embodiments of the present invention.

FIG. 10 depicts a block diagram of an exemplary electronic device 300 that may utilize an electronic package 200 according to an embodiment of the present invention. It should be appreciated that FIG. 10 provides only an illustration of one implementation of an embodiment of the present invention and does not imply any limitations with regard to the environment in which different embodiments may be implemented.

Electronic device 300 includes communications bus 552, which provides communications between electronic package(s) 200, memory 556, persistent storage 558, communications unit 560, and input/output (I/O) interface(s) 562. Memory 556 may be, for example, one or more random access memories (RAM) 564, cache memory 566, or any other suitable non-volatile or volatile storage device. Persistent storage 558 can include one or more of flash memory, magnetic disk storage device of an internal hard drive, a solid state drive, a semiconductor storage device, read-only memory (ROM), EPROM, or any other computer-readable tangible storage device that is capable of storing program instructions or digital information.

The media used by persistent storage 558 may also be removable. For example, a removable hard drive may be used for persistent storage 558. Other examples include an optical or magnetic disk that is inserted into a drive for transfer onto another storage device that is also a part of persistent storage 558, or other removable storage devices such as a thumb drive or smart card.

Communications unit 560 provides for communications with other electronic devices. Communications unit 560 includes one or more network interfaces. Communications unit 560 may provide communications through the use of either or both physical and wireless communications links. In other embodiments, electronic device 200 may be devoid of communications unit 560. Software may be downloaded to persistent storage 558 through communications unit 560.

I/O interface(s) 562 allows for input and output of data with other devices that may be connected to electronic device 200. For example, I/O interface 562 may provide a connection to external devices 568 such as a camera, mouse, keyboard, keypad, touch screen, and/or some other suitable input device. I/O interface(s) 562 also connects to display 570.

Display 570 provides a mechanism to display data to a user and may be, for example, a computer monitor. Alternatively, display 570 may be integral to electronic device 200 and may also function as a touch screen.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or surface of the carrier 208, regardless of the actual spatial orientation of the carrier 208. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A electronic package comprising:
a carrier comprising a top surface and a bottom surface configured to be electrically connected to a system board;
a semiconductor chip electrically connected to the top surface of the carrier;
a lid attached to the top surface of the carrier that encloses semiconductor chip, the lid comprising a perimeter recess within the upper half of the lid, the perimeter recess comprising a horizontal recess and vertical recess comprising two recess sidewalls; and
a lid-ring attached to the lid within the perimeter recess, the lid ring comprising a horizontal portion orthogonal and distally connected to a vertical portion, wherein the horizontal portion comprises a greater width than height, is parallel with the semiconductor chip, and is juxtaposed within the horizontal recess, wherein the vertical portion comprises a greater height than width and is juxtaposed between the two vertical recess sidewalls, wherein a perimeter sidewall of the lid-ring horizontal portion is coplanar with a perimeter sidewall of the lid, and wherein the lid-ring applies a contracting force against the upper half of the lid to exert a reverse bending moment upon the lid.

2. The electronic package of claim 1, wherein the lid is in thermal contact with the semiconductor chip.

3. The electronic package of claim 1, wherein a top surface of the lid and a top surface the lid-ring are coplanar.

4. The electronic package of claim 1, wherein the lid and the lid-ring are the same material.

5. The electronic package of claim 1, wherein the lid is fabricated from copper and the lid-ring is fabricated from aluminum.

6. The electronic package of claim 1, further comprising:
a heat sink thermally attached to a top surface of the lid.

7. The electronic package of claim 6, wherein the heat sink is further thermally attached to a top surface of the lid ring.

8. A electronic device comprising:
a carrier comprising a top surface and a bottom surface configured to be electrically connected to a system board;
a semiconductor chip electrically connected to the top surface of the carrier;
a lid attached to the top surface of the carrier that encloses semiconductor chip, the lid comprising a perimeter recess within the upper half of the lid, the perimeter recess comprising a horizontal recess and vertical recess comprising two recess sidewalls; and
a lid-ring attached to the lid within the perimeter recess, the lid ring comprising a horizontal portion orthogonal and distally connected to a vertical portion, wherein the horizontal portion comprises a greater width than height, is parallel with the semiconductor chip, and is juxtaposed within the horizontal recess, wherein the vertical portion comprises a greater height than width and is juxtaposed between the two vertical recess sidewalls, wherein a perimeter sidewall of the lid-ring horizontal portion is coplanar with a perimeter sidewall of the lid, and wherein the lid-ring applies a contracting force against the upper half of the lid to exert a reverse bending moment upon the lid.

9. The electronic device of claim 8, wherein the lid is in thermal contact with the semiconductor chip.

10. The electronic device of claim 8, wherein a top surface of the lid and a top surface the lid-ring are coplanar.

11. The electronic device of claim 8, wherein the lid and the lid-ring are the same material.

12. The electronic device of claim 8, wherein the lid is fabricated from copper and the lid-ring is fabricated from aluminum.

13. The electronic device of claim 8, further comprising: a heat sink thermally attached to a top surface of the lid.

14. The electronic device of claim 13, wherein the heat sink is further thermally attached to a top surface of the lid ring.

* * * * *